US006991999B2

(12) United States Patent
Fu et al.

(10) Patent No.: US 6,991,999 B2
(45) Date of Patent: Jan. 31, 2006

(54) BI-LAYER SILICON FILM AND METHOD OF FABRICATION

(75) Inventors: Li Fu, Santa Clara, CA (US); Shulin Wang, Santa Clara, CA (US); Luo Lee, Fremont, CA (US); Steven A. Chen, Fremont, CA (US); Errol Sanchez, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/948,461

(22) Filed: Sep. 7, 2001

(65) Prior Publication Data

US 2003/0047734 A1 Mar. 13, 2003

(51) Int. Cl.
*H01L 29/04* (2006.01)

(52) U.S. Cl. ....................... 438/488; 438/684; 438/764; 438/969

(58) Field of Classification Search ................. 438/361, 438/417, 430, 488, 491, 532, 592, 647, 657, 438/684, 764, 969, FOR 259, FOR 269, 438/FOR 353, FOR 393
See application file for complete search history.

(56) References Cited

U.S. PATENT DOCUMENTS

| | | | | | |
|---|---|---|---|---|---|
| 4,087,571 | A | * | 5/1978 | Kamins et al. | 438/489 |
| 4,631,804 | A | * | 12/1986 | Roy | 438/404 |
| 4,719,501 | A | * | 1/1988 | Nakagawa et al. | 257/64 |
| 5,141,892 | A | * | 8/1992 | Beinglass | 438/684 |
| 5,164,338 | A | * | 11/1992 | Graeger et al. | 438/50 |
| 5,177,569 | A | * | 1/1993 | Koyama et al. | 257/412 |
| 5,246,886 | A | * | 9/1993 | Sakai et al. | 438/488 |
| 5,344,796 | A | * | 9/1994 | Shin et al. | 438/479 |
| 5,707,882 | A | * | 1/1998 | Hamada et al. | 438/166 |
| 5,786,027 | A | | 7/1998 | Rolfson | |
| 5,837,598 | A | | 11/1998 | Aronowitz et al. | |
| 6,114,196 | A | | 9/2000 | Lin et al. | |
| 6,162,711 | A | | 12/2000 | Ma et al. | |
| 6,162,716 | A | | 12/2000 | Yu et al. | |
| 6,268,068 | B1 | * | 7/2001 | Heuer et al. | 428/620 |
| 6,362,511 | B1 | * | 3/2002 | Mizushima et al. | 257/412 |

FOREIGN PATENT DOCUMENTS

| | | | |
|---|---|---|---|
| EP | 1096038 | | 5/2001 |
| JP | 02140933 | | 5/1990 |
| JP | 04333238 A | * | 11/1992 |

OTHER PUBLICATIONS

International Search Report PCT/US02/28392.
Bu, H. et al., "Investigation of Polycrystalline Silicon Grain Structure with Single Wafer Chemical Deposition" Journal of Vacuum Science and Technology, vol. 19, No. 4, Jul. 2001, pp. 1898–1901, XP0022221378.

* cited by examiner

*Primary Examiner*—George Eckert
*Assistant Examiner*—N. Drew Richards
(74) *Attorney, Agent, or Firm*—Blakely Sokoloff Taylor & Zafman

(57) ABSTRACT

A bi-layer silicon electrode and its method of fabrication is described. The electrode of the present invention comprises a lower polysilicon film having a random grain microstructure, and an upper polysilicon film having a columnar grain microstructure.

20 Claims, 7 Drawing Sheets

BI-LAYER SILICON FILM AND METHOD OF FABRICATION

BACKGROUND OF THE INVENTION

1. Field of the Invention

The present invention relates to the field of semiconductor integrated circuit manufacturing and more specifically to a bi-layer silicon film and its method of fabrication.

2. Discussion of Related Art

In order to fabricate more complex and higher density integrated circuits such as microprocessors and memories, the size of device features must be continually reduced. An important feature which must be reduced in order to increase device density is the polysilicon gate length and correspondingly the polysilicon thickness of MOS transistors. Present polysilicon deposition processes form polysilicon films 802 having large and columnar grains 804 as shown in FIG. 6. The large and columnar grains 804 are beginning to play a critical role in the performance of the transistor as transistor gate lengths are shrunk to less than 0.18 microns. Dopants 806 which are subsequently added to the polysilicon film in order to reduce the resistance of the film utilize the grain boundaries 808 to diffuse throughout the polysilicon film 802. During subsequent thermal anneal steps used to drive and activate the dopants diffusion is restricted to the long columnar grain boundaries 808 causing areas 810 of undoped polysilicon, which is especially a problem at the polysilicon 802/gate dielectric 812 interface. The lack of uniform distribution of dopants in the polysilicon, known as "poly depletion", detrimentally affects the performance of the fabricated transistor especially as a gate lengths decrease to below 0.18 microns. Additionally, during dopant drive and activation anneals the long columnar grain boundaries 808 provide a path for fast diffusion of dopants 806 to the gate/dielectric interface where they can penetrate the dielectric and alter the electrical performance of the device.

SUMMARY OF THE INVENTION

A bi-layer silicon electrode and its method of fabrication is described. The electrode of the present invention comprises a lower polysilicon film having a random grain microstructure, and an upper polysilicon film having a columnar grain microstructure.

DETAILED DESCRIPTION OF THE PRESENT INVENTION

The present invention is a novel bi-layer silicon film and its method of fabrication. In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention.

Figure 1:
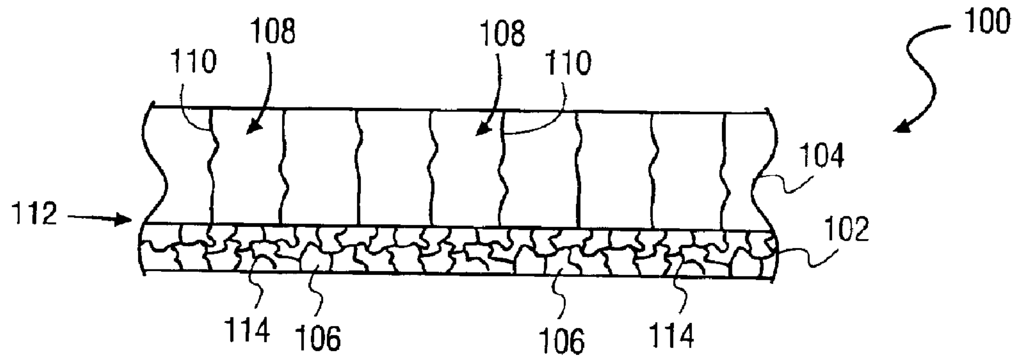
FIG. 1 is an illustration of a cross-sectional view of a bi-layer silicon film in accordance with the present invention.

The present invention is a novel bi-layer silicon film and its method of fabrication. An example of a bi-layer silicon film 100 in accordance with the present invention is illustrated in FIG. 1. Bi-layer silicon film 100 includes an upper polycrystalline silicon film 104 formed directly on a lower polycrystalline silicon film 102. Lower polycrystalline silicon film 102 is a polycrystalline silicon film having small and random grain boundary structure as opposed to a columnar grain structure. The lower polycrystalline silicon film has an average grain size between 50–500 Å and has a vertical dimension which is approximately the same as the horizontal dimension. The lower polycrystalline silicon film 102 has a crystal orientation which is dominated by the <111> direction.

Upper polycrystalline silicon film 104 is a polycrystalline silicon film having large columnar grains 106. The grains 106 have a vertical dimension to horizontal dimension of at least 2:1 and preferably at least 4:1. The crystal orientation of the upper polycrystalline silicon film 104 is dominated by the <220> direction. The average grain size of the columnar grains are about 200–700 Å in the horizontal direction. The long columnar grain boundaries 110 of the upper polysilicon film 104 are perpendicular to the interface 112 of the upper polysilicon film 104 and the lower polysilicon film 102.

The perpendicular grain boundaries 110 provide a path for the fast defusion of dopants, such as boron, during subsequent ion-implantation and thermal anneal steps. The random grains 106 and therefore grain boundaries 114 of the lower polycrystalline silicon film greatly reduces or slows down dopant diffusion within the film. The lower polycrystalline silicon film 102 can therefore be used to prevent dopant diffusion into underlying films, such as gate oxides. By forming a bi-layer silicon film 100 with a top columnar structure the composite film 100 is characterized as having a fast diffusion within the columnar portion of the film and a diffusion barrier in the lower portion of the film. The thickness of the lower polycrystalline silicon film 102 is kept as thin as possible but yet is thick enough to prevent dopants from diffusing therethrough while the film is heated to a temperature and for a period of time necessary to activate the incorporated dopant. In order to provide good blocking functionality lower polycrystalline silicon film 104 should be at least several grains thick. Additionally, the thickness of the upper columnar grain silicon film 104 is kept sufficiently thick to control the resistivity of the fabricated electrode. In an embodiment of the present invention, the lower polycrystalline silicon film 102 has a thickness between 200–500 Å and the upper polycrystalline silicon film 104 has a thickness between 1200–1800 Å for a total thickness of the bi-layer silicon film 100 of approximately 1500–2000 Å.

By optimizing the film thickness of the two layers, a film with a homogeneous dopant diffusion and barrier to dopant penetration into underlying films can be achieved. In an embodiment of the present invention, the columnar grain film 104 is much thicker than the lower random grain polycrystalline silicon film 102. The bi-layer polycrystalline silicon film 100 is ideally used in any application where a homogeneous dopant distribution with minimum dopant penetration in the underlying films, is desired. Examples of applications of the bi-layer silicon film 100 include but are not limited to gate electrodes for metal oxide semiconductor transistors, capacitor electrodes for capacitors, and interconnects for interconnecting devices such as transistors and capacitors together.

Figure 2:
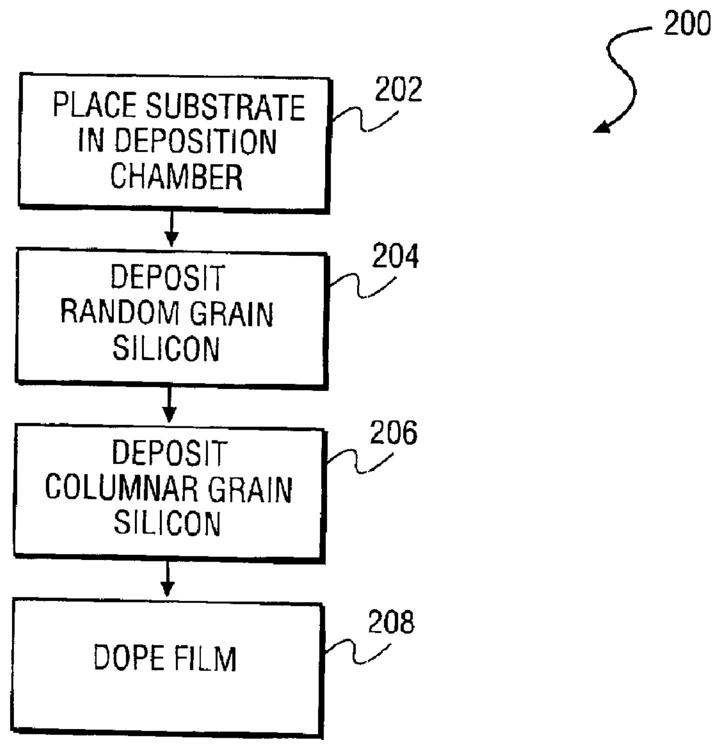
FIG. 2 is an illustration of a method of forming a bi-layer silicon film in accordance with the present invention.

A method of fabricating a bi-layer polycrystalline silicon film in accordance with the present invention is set forth in flow chart 200 illustrated in FIG. 2. The method of the present invention will be illustrated and described in a process used to form a p type MOS transistor having a bi-layer silicon gate electrode as shown in FIGS. 3A–3D.

Figure 3A:
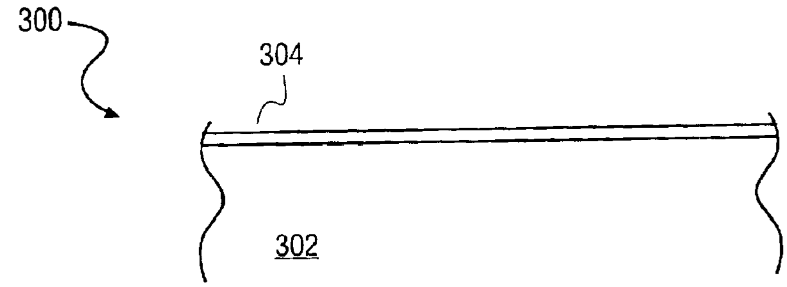
FIG. 3A–3D illustrate a method of fabricating a transistor having a bi-layer silicon gate electrode.

The first step in the method of the present invention as set forth in step 202 of flow chart 200 in FIG. 2, is to place a substrate or wafer on which the bi-layer silicon film is to be formed in a deposition reactor. In order to fabricate an MOS transistor with a bi-layer silicon film gate electrode, a substrate or wafer, such as substrate 300 as shown in FIG. 3A is provided. Substrate 300 includes a single crystalline silicon substrate 302 having a gate dielectric layer 304 formed thereon. The single crystalline silicon substrate will typically be slightly doped with p type impurities (e.g., arsenic or phosphorous) for NMOS device and slightly doped with n type dopants (e.g., boron) for PMOS device. The gate dielectric can be any suitable dielectric layer such as but not limited to silicon dioxide, silicon oxynitride, and nitrided oxides. Additionally, substrate 300 will typically include isolation regions (not shown) such as LOCOS or shallow trench (STI) regions to isolate the individual transistor formed in substrate 300.

Substrate 300 is placed in a chemical vapor deposition (CVD) reactor which is suitable for depositing the bi-layer silicon film of the present invention. An example of a suitable CVD apparatus is the resistively heated low pressure chemical vapor deposition reactor illustrated in FIG. 4–6. Other suitable deposition reactors include the POLYgen Reactor manufactured by Applied Materials, Inc.

Figure 4:
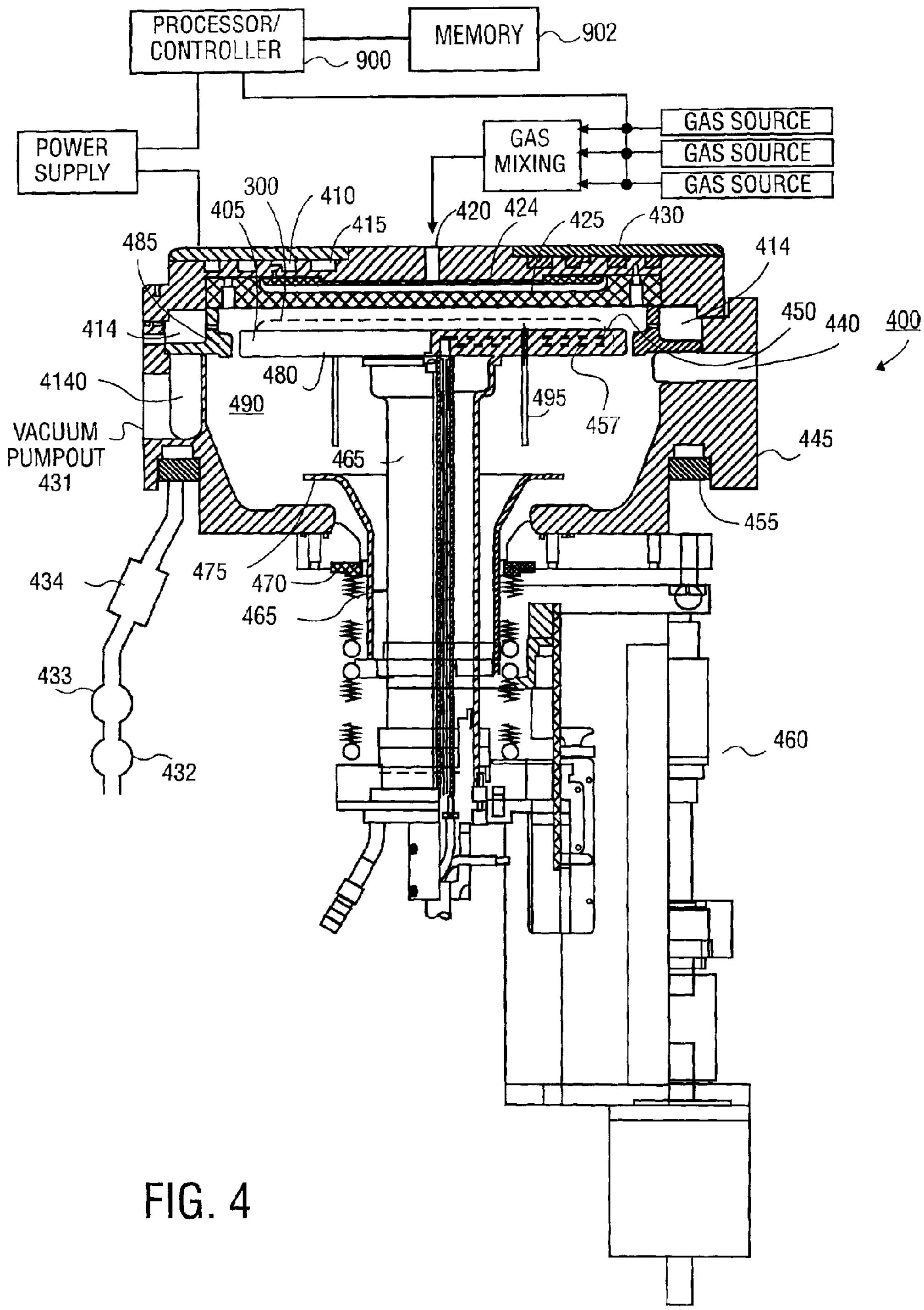
FIG. 4 shows an illustration of a cross-sectional sideview of a processing chamber comprising a resistive heater in a "wafer process" position which can be used to form the bi-layer silicon film of the present invention.
Figure 5:
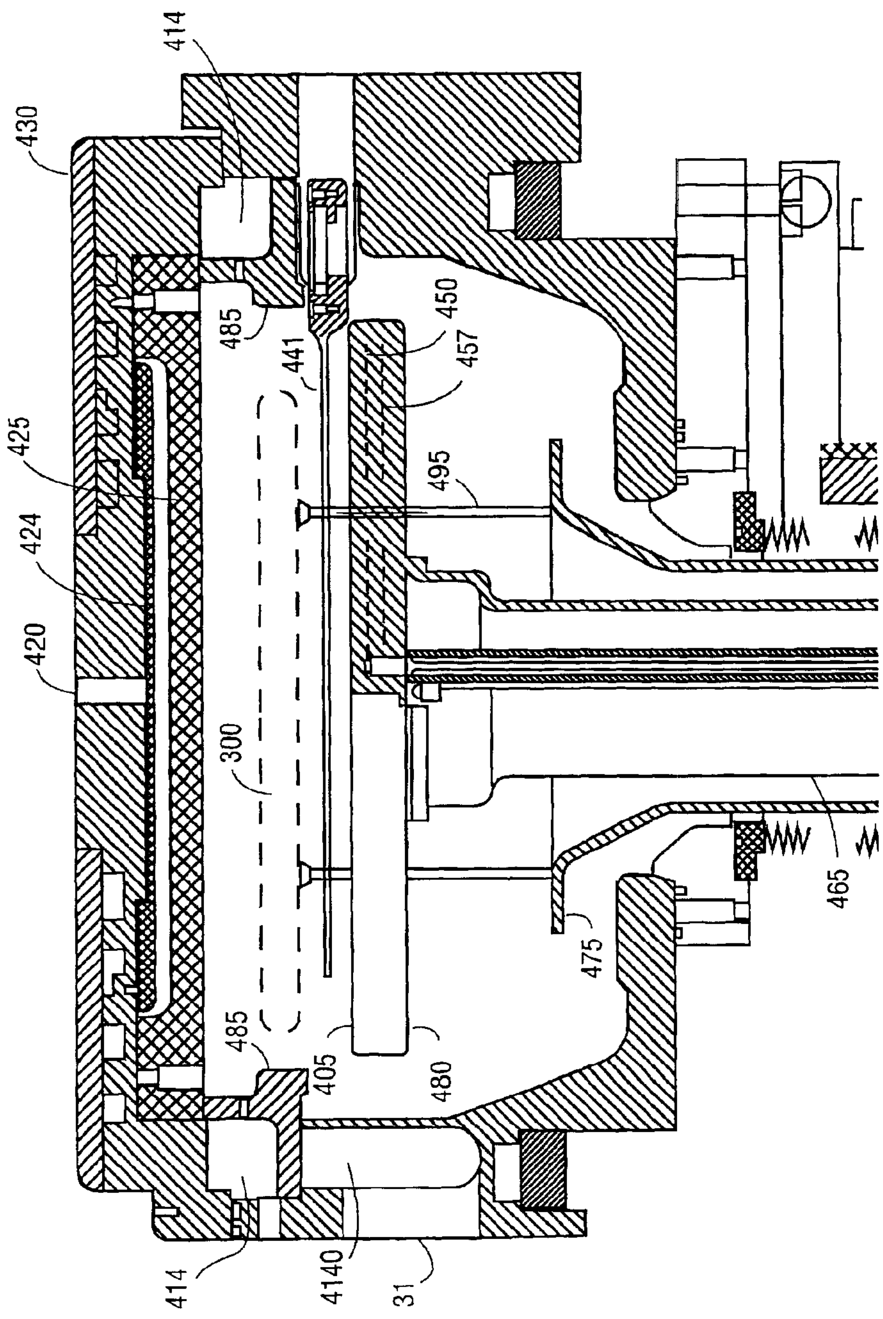
FIG. 5 shows an illustration of a similar cross-sectional sideview as in FIG. 4 in a wafer separate position.
Figure 6:
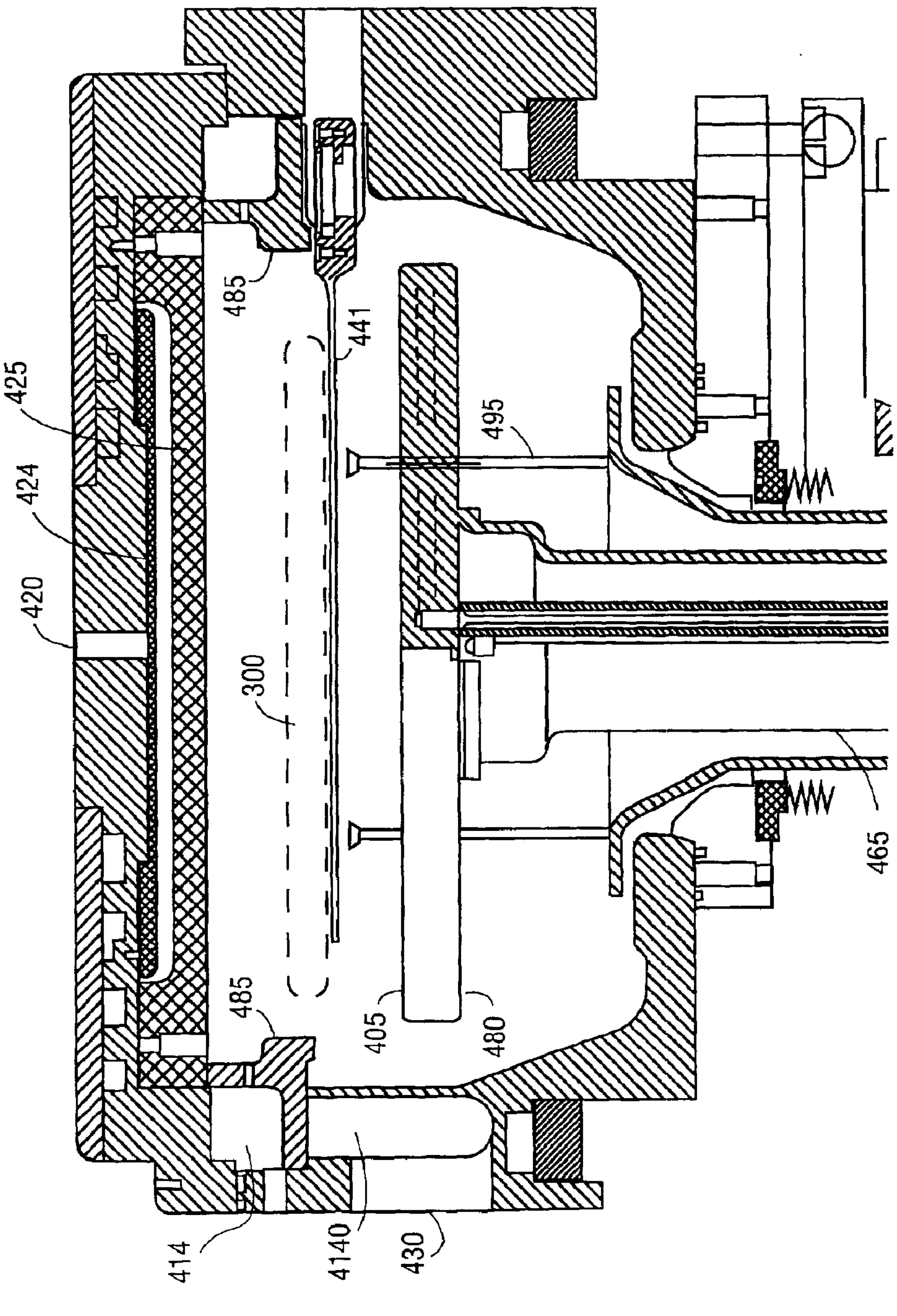
FIG. 6 shows an illustration of a similar cross-sectional sideview as in FIG. 4 in a wafer load position.

Referring to FIGS. 4–6, a low-pressure chemical vapor deposition (LPCVD) chamber is described. FIGS. 4–6 each show cross-sectional views of one type of reactor such as a resistive reactor used to practice the invention. FIGS. 4–6 each show cross-sectional views of a chamber through two different cross-sections, each cross-section representing a view through approximately one-half of the chamber.

The LPCVD chamber 400 illustrated in FIGS. 4–6 is constructed of materials such that, in this embodiment, a pressure of greater than or equal to 100 Torr can be maintained. For the purpose of illustration, a chamber of approximately in the range of 5–6 liters is described. FIG. 4 illustrates the inside of process chamber body 445 in a "wafer-process" position. FIG. 5 shows the same view of the chamber in a "wafer-separate" position. FIG. 6 shows the same cross-sectional side view of the chamber in a "wafer-load" position. In each case, a wafer 300 is indicated in dashed lines to indicate its location in the chamber.

FIG. 4–6 show chamber body 445 that defines reaction chamber 490 in which the thermal decomposition of a process gas or gases takes place to form a film on a wafer (e.g., a CVD reaction). Chamber body 445 is constructed, in one embodiment, of aluminum and has passages 455 for water to be pumped therethrough to cool chamber 445 (e.g., a "cold-wall" reaction chamber). Resident in chamber 490 is resistive heater 480 including, in this view, susceptor 405 supported by shaft 465. Susceptor 405 has a surface area sufficient to support a substrate such as a semiconductor wafer 300 (shown in dashed lines).

Process gas enters an otherwise sealed chamber 490 through gas distribution port 420 in a top surface of chamber lid 430 of chamber body 445. The process gas then goes through blocker plate 425 to distribute the gas about an area consistent with the surface area of a wafer. Thereafter, the process gas is distributed through perforated face plate 425 located, in this view, above resistive heater 480 and coupled to chamber lid 430 inside chamber 490. One objective of the combination of blocker plate 424 with face plate 425 in this embodiment is to create a uniform distribution of process gas at the substrate, e.g., wafer.

A substrate 300, such as a wafer, is placed in chamber 490 on susceptor 405 of heater 480 through entry port 440 in a side portion of chamber body 445. To accommodate a wafer for processing, heater 480 is lowered so that the surface of susceptor 405 is below entry port 440 as shown in FIG. 6. Typically by a robotic transfer mechanism, a wafer is loaded by way of, for example, a transfer blade 441 into chamber 490 onto the superior surface of susceptor. Once loaded, entry 440 is sealed and heater 480 is advanced in a superior (e.g., upward) direction toward face plate 425 by lifter assembly 460 that is, for example, a stepper motor. The advancement stops when the wafer 300 is a short distance (e.g., 400–700 mils) from faceplate 425 (see FIG. 4). In the wafer-process position, chamber 490 is effectively divided into two zones, a first zone above the superior surface of susceptor 405 and a second zone below the inferior surface of susceptor 405. It is generally desirable to confine polysilicon film formation to the first zone.

At this point, process gas controlled by a gas panel flows into chamber 490 through gas distribution port 420, through blocker plate 424 and perforated face plate 425. Process gas thermally decompose to form a film on the wafer. At the same time, an inert bottom-purge gas, e.g., nitrogen, is introduced into the second chamber zone to inhibit film formation in that zone. In a pressure controlled system, the pressure in chamber 490 is established and maintained by a pressure regulator or regulators coupled to chamber 490. In one embodiment, for example, the pressure is established and maintained by baretone pressure regulator(s) coupled to chamber body 445 as known in the art. In this embodiment, the baretone pressure regulator(s) maintains pressure at a level of equal to or greater than 150 Torr.

Residual process gas is pumped from chamber 490 through pumping plate 485 to a collection vessel at a side of chamber body 445 (vacuum pumpout 31). Pumping plate 485 creates two flow regions resulting in a gas flow pattern that creates a uniform silicon layer on a substrate.

Pump 432 disposed exterior to apparatus provides vacuum pressure within pumping channel 4140 (below channel 414 in FIGS. 4–6) to draw both the process and purge gases out of the chamber 490 through vacuum pumpout 431. The gas is discharged from chamber 490 along a discharge conduit 433. The flow rate of the discharge gas through channel 4140 is preferably controlled by a throttle valve 434 disposed along conduit 433. The pressure within processing chamber 490 is monitored with sensors (not shown) and controlled by varying the cross-sectional area of conduit 433 with throttle valve 434. Preferably, a controller or processor 900 receives signals from the sensors that indicate the chamber pressure and adjusts throttle valve 434 accordingly to maintain the desired pressure within chamber 490. A suitable throttle valve for use with the present invention is described in U.S. Pat. No. 5,000,225 issued to Murdoch and assigned to Applied Materials, Inc.

Once wafer processing is complete, chamber 490 may be purged, for example, with an inert gas, such as nitrogen. After processing and purging, heater 480 is advanced in an inferior direction (e.g., lowered) by lifter assembly 460 to the position shown in FIG. 5. As heater 480 is moved, lift pins 495, having an end extending through openings or through bores in a surface of susceptor 405 and a second end extending in a cantilevered fashion from an inferior (e.g., lower) surface of susceptor 405, contact lift plate 475 positioned at the base of chamber 490. As is illustrated in FIG. 5, in one embodiment, at the point, life plate 475 remains at a wafer-process position (i.e., the same position the plate was in FIG. 4). As heater 480 continues to move in an inferior direction through the action of assembly 460, lift pins 495 remain stationary and ultimately extend above the susceptor or top surface of susceptor 405 to separate a processed wafer from the surface of susceptor 405. The surface of susceptor 405 is moved to a position below opening 440.

Once a processed wafer is separated from the surface of susceptor 405, transfer blade 441 of a robotic mechanism is inserted through opening 440 beneath the heads of lift pins 495 and a wafer supported by the lift pins. Next, lifter assembly 460 inferiorly moves (e.g., lowers) heater 480 and lifts plate 475 to a “wafer load” position. By moving lift plates 475 in an inferior direction, lift pins 495 are also moved in an inferior direction, until the surface of the processed wafer contacts the transfer blade. The processed wafer is then removed through entry port 440 by, for example, a robotic transfer mechanism that removes the wafer and transfers the wafer to the next processing step. A second wafer may then be loaded into chamber 490. The steps described above are generally reversed to bring the wafer into a process position. A detailed description of one suitable lifter assembly 460 is described in U.S. Pat. No. 5,772,773, assigned to Applied Materials, Inc. of Santa Clara, Calif.

In a high temperature operation, such as LPCVD processing to form a polycrystalline silicon film, the heater temperature inside chamber 490 can be as high as 750° C. or more. Accordingly, the exposed components in chamber 490 must be compatible with such high temperature processing. Such materials should also be compatible with the process gases and other chemicals, such as cleaning chemicals (e.g., $NF_3$) that may be introduced into chamber 490. Exposed surfaces of heater 480 may be comprised of a variety of materials provided that the materials are compatible with the process. For example, susceptor 405 and shaft 465 of heater 480 may be comprised of similar aluminum nitride material. Alternatively, the surface of susceptor 405 may be comprised of high thermally conductive aluminum nitride materials (on the order of 95% purity with a thermal conductivity from 140 W/mK) while shaft 465 is comprised of a lower thermally conductive aluminum nitride. Susceptor 405 of heater 480 is typically bonded to shaft 465 through diffusion bonding or brazing as such coupling will similarly withstand the environment of chamber 490.

FIG. 4 also shows a cross-section of a portion of heater 480, including a cross-section of the body of susceptor 405 and a cross-section of shaft 465. In this illustration, FIG. 4 shows the body of susceptor 405 having two heating elements formed therein, first heating element 450 and second heating element 457. Each heating element (e.g., heating element 450 and heating element 457) is made of a material with thermal expansion properties similar to the material of the susceptor. A suitable material includes molybdenum (Mo). Each heating element includes a thin layer of molybdenum material in a coiled configuration.

In FIG. 4, second heating element 457 is formed in a plane of the body of susceptor 405 that is located inferior (relative to the surface of susceptor in the figure) to first heating element 450. First heating element 450 and second heating element 457 are separately coupled to power terminals. The power terminals extend in an inferior direction as conductive leads through a longitudinally extending opening through shaft 465 to a power source that supplies the requisite energy to heat the surface of susceptor 405. Extending through openings in chamber lid are two pyrometers, first pyrometer 410 and second pyrometer 415. Each pyrometer provides data about the temperature at the surface of susceptor 405 (or at the surface of a wafer on susceptor 405). Also of note in the cross-section of heater 480 as shown in FIG. 4 is the presence of thermocouple 470. Thermocouple 470 extends through the longitudinally extending opening through shaft 465 to a point just below the superior or top surface of susceptor 405.

Figure 3B:
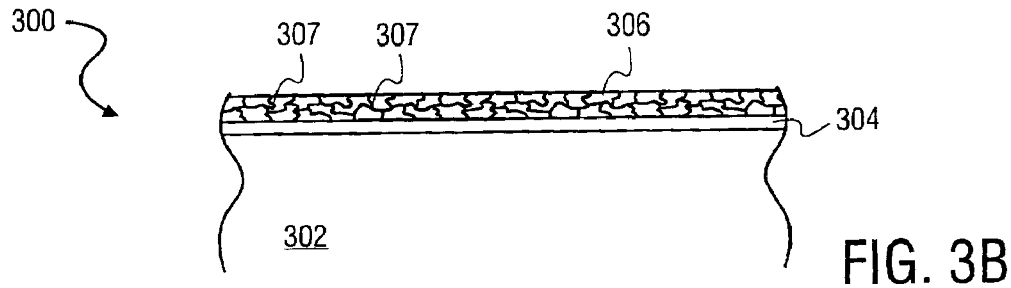

Next, as set forth in block 204 of flow chart 200 shown in FIG. 2, a random grain polycrystalline silicon film having small and random grain boundaries is formed. In an embodiment of the present invention, where a bi-layer polycrystalline silicon film is used to form a gate electrode, the random grain boundary polysilicon film 306 is formed directly onto gate dielectric 304 as shown in FIG. 3B. The lower polycrystalline silicon film has an average grain size between 50–500 Å and has a vertical dimension which is approximately the same as the horizontal dimension. The polycrystalline silicon film 306 has a crystal orientation which is dominated by the <111> direction.

In order to deposit a random grain boundary polysilicon film in an embodiment of the present invention, first the desired deposition pressure and temperature are obtained and stabilized in chamber 490. While achieving pressure and temperature stabilization, a stabilization gas such as $N_2$, He, Ar, or combinations thereof are fed into chamber 490. In a preferred embodiment of the present invention the flow and concentration of the dilution gas used in the random grain polysilicon deposition is used to achieve temperature and pressure stabilization. Using the dilution gas for stabilization enables the dilution gas flow and concentrations to stabilize prior to polysilicon deposition.

In an embodiment of the present invention the chamber is evacuated to a pressure between 150–350 Torr with 200–275 Torr being preferred and the heater temperature raised to between 700–740° C. and preferably between 710–720° C. while the dilution gas is fed into chamber 490 at a flow rate between 10–30 slm. According to the present invention the dilution gas consist of $H_2$ and an inert gas, such as but not limited to nitrogen ($N_2$), argon (Ar), and helium (He), and combinations thereof. For the purpose of the present invention an inert gas is a gas which is not consumed by or which does not interact with the reaction used to deposit the polysilicon film and does not interact with chamber components during polysilicon film deposition. In a preferred embodiment of the present invention the inert gas consist only of nitrogen ($N_2$). In an embodiment of the present invention $H_2$ comprises more than 8% and less than 20% by volume of the dilution gas mix with the dilution gas mix preferably having between 10–15% $H_2$ by volume.

In the present invention the dilution gas mix has a sufficient $H_2$/inert gas concentration ratio such that a subsequently deposited polysilicon film is dominated by the <111> crystal orientation as compared to the <220> crystal orientation. Additionally, the dilution gas mix has a sufficient $H_2$/inert gas concentration ratio so that the subsequently deposited polycrystalline silicon film has a random grain structure with an average grain size between 50–500 Å.

In an embodiment of the present invention the dilution gas mix is supplied into chamber 490 in two separate components. A first component of the dilution gas mix is fed through distribution port 420 in chamber lid 430. The first component consist of all the $H_2$ used in the dilution gas mix and a portion (typically about ⅔) of the inert gas used in the dilution gas mix. The second component of the dilution gas mix is fed into the lower portion of chamber 490 beneath heater 480 and consists of the remaining portion (typically about ⅓) of the inert gas used in the dilution gas mix. The purpose of providing some of the inert gas through the bottom chamber portion is to help prevent the polycrystalline silicon film from depositing on components in the lower portion of the chamber. In the embodiment of the present invention between 8–18 slm with about 9 slm being preferred of an inert gas (preferably $N_2$) is fed through the top distribution plate 420 while between 3–10 slm, with 4–6 slm being preferred, of the inert gas (preferably $N_2$) is fed into the bottom or lower portion of chamber 490. The desired percentage of $H_2$ in the dilution gas mix is mixed with the inert gas prior to entering distribution port 420.

Next, once the temperature, pressure, and gas flows have been stabilized a first process gas mix comprising a silicon source gas and a dilution gas mix comprising $H_2$ and an inert gas is fed into chamber 490 to deposit a random grain polycrystalline silicon film 306 on substrate 300 as shown in FIG. 3B. In the preferred embodiment of the present invention the silicon source gas is silane ($SiH_4$) but can be other silicon source gases such as disilane ($Si_2H_6$). According to the preferred embodiment of the present invention between 50–150 sccm, with between 70–100 sccm being preferred, of silane ($SiH_4$) is added to the dilution gas mix already flowing and stabilized during the temperature and pressure stabilization step. In this way during the deposition of random grain polysilicon, a first process gas mix comprising between 50–150 sccm of silane ($SiH_4$) and between 10–30 slm of dilution gas mix comprising $H_2$ and an inert gas is fed into the chamber while the pressure in chamber 490 is maintained between 150–350 Torr and the temperature of susceptor 405 is maintained between 700–740° C. (It is to be appreciated that in the LPCVD reactor 400 the temperature of the substrate or wafer 300 is typically about 20–30° cooler than the measured temperature of susceptor 405). In the preferred embodiment of the present invention the silicon source gas is added to the first component (upper component) of the dilution gas mix and flows into chamber 490 through inlet port 420.

The thermal energy from susceptor 405 and wafer 300 causes the silicon source gas to thermally decompose and deposit a random silicon polysilicon film 306 on gate dielectric as shown in FIG. 3B. In an embodiment of the present invention only thermal energy is used to decompose the silicon source gas without the aid of additional energy sources such as plasma or photon enhancement.

Figure 7:
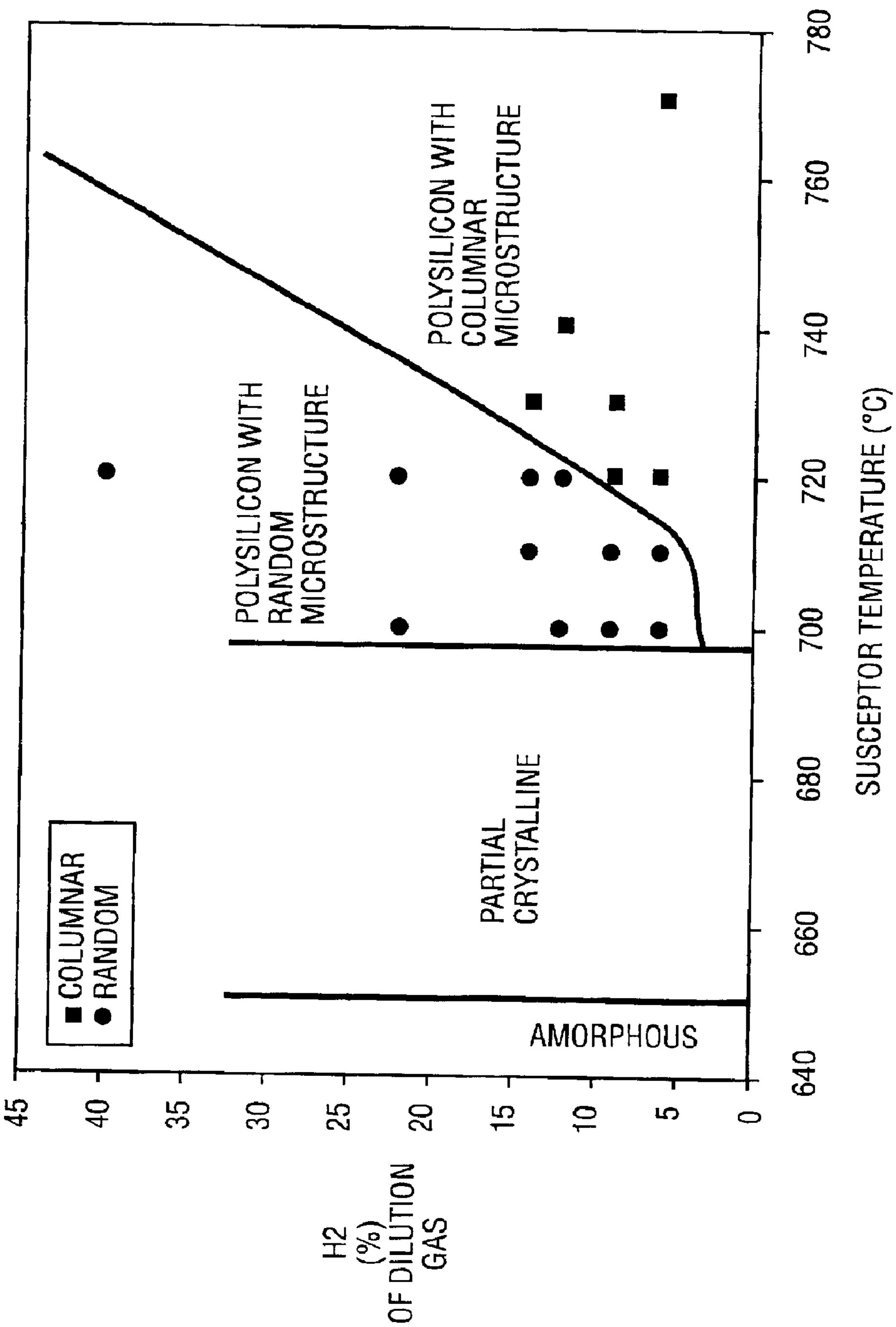
FIG. 7 is a graph which illustrates how the microstructure of a polycrystalline silicon film varies from random microstructure to a columnar microstructure depending upon the H2 dilution percent and the deposition temperature.
Figure 8:
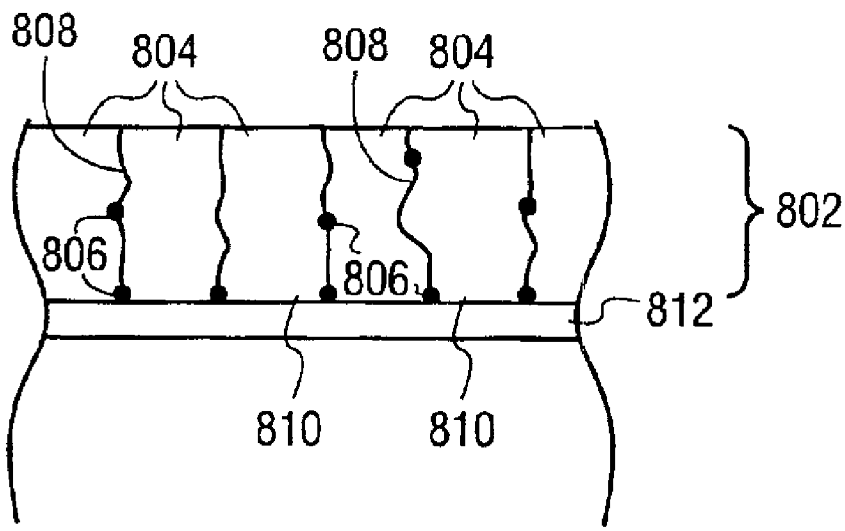
FIG. 8 is an illustration of a prior art polysilicon film with large and columnar grains.

As the first process gas mix is fed into chamber 490, the silicon source gas decomposes to provide silicon atoms which in turn form a random grain polycrystalline silicon film 306 on dielectric layer 304. It is to be appreciated that $H_2$ is a reaction product of the decomposition of silane ($SiH_4$). By adding a suitable amount of $H_2$ in the process gas mix the decomposition of silane ($SiH_4$) is slowed which enables a polycrystalline silicon film 306 to be formed with small and random grains 307. In the present invention the volume percent of $H_2$ in the dilution gas is used to manipulate the silicon resource reaction across the wafer. FIG. 7 is a plot of $H_2$ volume percent of dilution gas vs. deposition (susceptor) temperature (° C.) which illustrates how temperature and the volume percent of $H_2$ in the dilution gas determines whether a polycrystalline silicon film with random gains or a polycrystalline silicon film with columnar grains is formed. (The films in FIG. 7 were grown utilizing silane ($SiH_4$) as the silicon gas at a deposition pressure of 325–350 torr with a deposition rate of approximately 2400 Å/minute) By having $H_2$ comprise between 8–20% of the dilution gas mix random grains having an average grain size between 50–500 Å can be formed. Additionally, by including a sufficient amount of $H_2$in the dilution gas mix a random grain polycrystalline silicon film 306 which is dominated by the <111> crystal orientation, as opposed to the <220> crystal orientation is formed.

According to the present invention the deposition pressure, temperature, and process gas flow rates and concentration are chosen so that a polysilicon film is deposited at a rate between 1500–5000 Å per minute with between 2000–3000 Å per minute being preferred. The process gas mix is continually fed into chamber 490 until a polysilicon film 306 of a desired thickness is formed. In an embodiment of the present invention, random grain polycrystalline silicon film 306 is used as a diffusion barrier to prevent subsequently implanted dopants, such as boron, from passing through the film and entering the dielectric layer 304. In such a case the random grain polycrystalline silicon film 306 is formed sufficiently thick to prevent boron from substantially diffusing through the film and into the gate dielectric 304 during the subsequent thermal annealing step used to activate the dopants. When generating a diffusion barrier for gate electrode applications a polysilicon film 306 having a thickness between 200–500 Å has been found suitable.

Figure 3C:
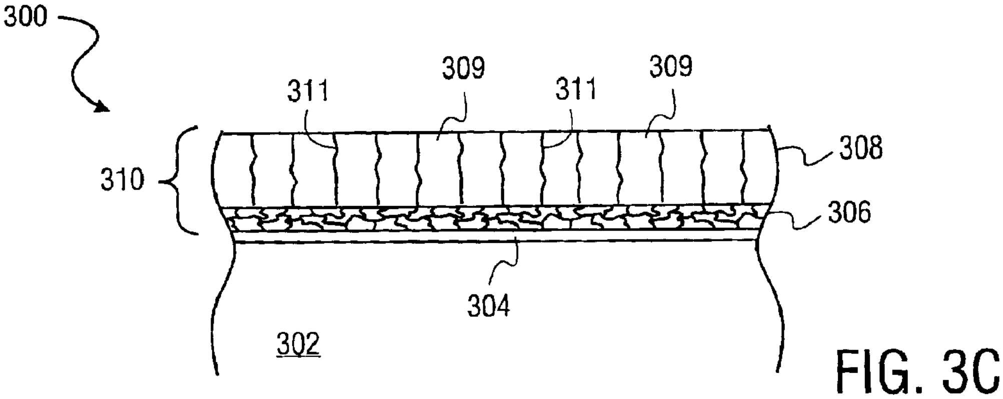

Next, as set forth in block 206 of flow chart 200 as shown in FIG. 2, after random grain polysilicon film 306 is formed, a polycrystalline silicon film having columnar grains is formed directly onto the random grain boundary polysilicon film 306 as shown in FIG. 3C. The grains 309 have a vertical dimension to horizontal dimension of at least 2:1 and preferably at least 4:1.

A columnar grain silicon film can be formed by providing a second process gas mix comprising a silicon source gas, such as but not limited to silane and a dilution gas into the chamber 490 while maintaining a pressure between 150–350 torr and heater temperature between 700–740° C. As shown in FIG. 7, a columnar grain silicon film can be achieved by controlling the amount of $H_2$ (volume percent) included in the dilution gas of the second process gas mix. A suitable columnar grain silicon film 308 as shown in FIG. 3C can be formed by flowing into deposition chamber 490 a second process gas mix comprising a silicon source gas and a dilution gas wherein the dilution gas comprises an inert gas (e.g., $N_2$, Ar, and He) and hydrogen gas ($H_2$) wherein $H_2$ comprises less than 8% by volume of the dilution gas mix and preferably less than 5% by volume of the dilution gas. In an embodiment of the present invention, the columnar grain silicon film 308 is formed with a second process gas mix consisting only of a silicon source gas and a dilution gas consisting only of an inert gas and no $H_2$. A polycrystalline silicon film 308 having columnar grains can be formed by flowing a second process gas mix comprising between 50–150 sccm of silane ($SiH_4$) and between 10–30 slm of a dilution gas mix comprising less than 5% $H_2$ by volume and an inert gas while the pressure in chamber 490 is maintained between 150–350 torr and the temperature of the susceptor 405 maintained between 700–740° C.

Like the first process gas mix for forming the random grain silicon film, the second process gas mix for the columnar grain silicon has two components wherein the first component enters through distribution port 420 and contains about ⅔ of the dilution gas and all of the silicon containing gas and wherein the second component consist of the remaining ⅓ of the dilution gas and is fed into the lower portion of chamber 490. If $H_2$ is included during the formation of the columnar grain polycrystalline film it is mixed with the inert gas prior to entering the chamber and enters the chamber with the first component through distribution port 420 in chamber lid 430.

As it is evident by the plot of FIG. 7, the microstructure (i.e., random grain or columnar grain) of a polysilicon film for given process conditions, is dependant upon either the $H_2$ concentration in the dilution gas and/or the deposition temperature (i.e., the susceptor temperature). That is, for a given set of process conditions, the amount of $H_2$ contained in the dilution gas mix can be varied in order to achieve either a columnar grain structure or a random grain structure. Additionally, for a given set of process parameters, the deposition temperature can be varied to either form a columnar grain film or a random grain film. In an embodiment of the present invention, the deposition of the columnar grain silicon film occurs under the same deposition temperature, deposition pressure and process gas mix and flow rates as the random grain silicon film 306, except that the dilution gas mix includes less than 5% by volume of $H_2$ and preferably no $H_2$. In yet another embodiment of the present invention, the same process gas mix is use to form the columnar grain silicon film as is used to form the random grain silicon film 308, but the deposition temperature (heater temperature) is increased to a temperature sufficient to yield polysilicon with a columnar grain structure.

In a preferred embodiment of the present invention, the polycrystalline silicon film 308 with columnar grain microstructure is formed "insitu" with or in the same chamber (i.e., chamber 490) as the random grain polysilicon film 304. In this way, polysilicon film 304 is not exposed to an oxidizing ambient or to contaminants before the formation of columnar polysilicon film 308 is formed thereby enabling a clean interface to be achieved between the films. In an embodiment of the present invention, when polysilicon film 306 and 308 are formed insitu, the deposition chamber is purged with an inert gas for approximately 5 seconds to insure that all $H_2$ is removed from the chamber prior to deposition of the columnar grain polysilicon film 308. The purge can occur at the same deposition temperature and pressure and with the same inert gas flows as used to deposit the polycrystalline films. In this way, a fast, efficient and continuous process can be used to form the bi-layers silicon film 310.

Columnar grain silicon film 308 is formed until the desired thickness of silicon film 308 is obtained. In an embodiment of the present invention, where the bi-layer silicon film is used to form a gate electrode, columnar grain silicon film 308 can be formed to a thickness between 1500–1800 Å to achieve a total film thickness of bi-layer silicon film 310 of approximately 2000 Å. It is to be appreciated, however, that the thickness of columnar grain silicon film 308 can be made to any thickness desired for any specific application. After columnar grain polysilicon film 308 has been completed, the flow of the second process gas mix is stopped and the susceptor temperature reduced and heater 480 lowered from the process position to the load position and wafer 300 removed from chamber 490. At this time, the formation of a bi-layer silicon in accordance with an embodiment of the present invention is complete.

Figure 3D:
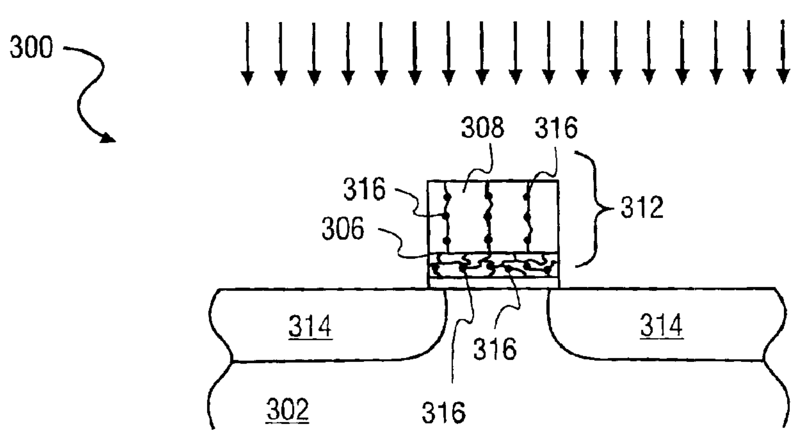

Next, as set forth in step 208 of flow chart 200 of FIG. 2, the bi-layer silicon film can be doped to a desired conductivity type and level, if desired. Bi-layer polysilicon film 310 can be doped by well-known ion-implantation and thermal anneal steps. The bi-layer silicon film 310 can be doped while in blanket form over substrate 300 (i.e., prior to patterning) or after patterning into, for example, interconnects or electrodes. When forming an MOS transistor, it is preferable to ion-implant the bi-layer polysilicon film after it has been patterned with well-known photolithography and etching techniques into gate electrode 312 as shown in FIG. 3D. In this way, the ion-implantation step used to counter doped the single crystalline silicon substrate to form source/drain regions 314, can also be used to dope the gate electrode and thereby reduces resistivity.

When forming a PMOS transistor, p type impurities 316 (e.g., boron) are implanted into single crystalline silicon substrate 302 in alignment with the outside edges of gate electrode 312 to form source/drain regions 314 as well as into bi-layer polysilicon gate electrode 312. Boron can be implanted utilizing BF3 as a source at a dose in the amount of $1–5\times10^{16}$ atoms/cm$^2$ to achieve a dopant density on the order of $1\times10^{20}$ atoms/cm$^3$ (If an n type device is to be formed n type impurities such as arsenic or phosphorous or implanted into a p type single crystalline substrate). The ion-implantation step generally places dopants into the columnar grain polysilicon film 308 of bi-layer polysilicon film 310. A subsequent thermal anneal is used to drive and activate the dopants deep into the columnar grain silicon film as well as into the random grain silicon film 306 as shown in FIG. 3D. The microstructure of the columnar grain polysilicon film 308 enables the fast and uniform diffusion of dopants throughout the film via the long columnar grain boundaries 311. Dopants 316 reach the random grain silicon film 306 and diffuse throughout the many grain boundaries of the random grain silicon film. Because of the many grain boundaries, the dopants diffuse less in the vertical direction (as compared to the columnar grain silicon) and so the random grain boundary provides a blocking effect which prevents the dopants from penetrating into the underlying gate dielectric layer 304. This especially useful when the dopant impurity is boron. In an embodiment of the present invention, the random grain polysilicon film 306 is formed to a thickness sufficient to block boron penetration into the underlying gate oxide during the thermal anneal used to drive and activate the dopants. The dopants can be driven and activated with any well-known process, such as for example, a rapid thermal process at a temperature between 800–1100° C. for a period of time between 30–120 seconds in an ambient comprising for example 10% $O_2$ in 90% $N_2$.

If desired, silicide or other metal layers can be formed on the top of gate electrode 312 as well as onto source/drain regions 314 to further reduce the parasitic resistance of the device. At this point, the fabrication of a MOS transistor having a bi-layer polycrystalline silicon gate electrode is complete.

Referencing back to LPCVD apparatus 400 as shown in FIG. 4, apparatus 400 includes a processor/controller 900 and a memory 902, such as a hard disk drive. The processor/controller 900 includes a single board (SBC) analog and digital input/output boards, interface boards and stepper motor controller board. Processor/controller 900 controls all activity of the LPCVD chamber. The system controller executes system control software, which is a computer program stored in a computer readable medium such as memory 902. The computer program includes sets of instructions that dictate the timing, mixture of gases, chamber pressure, heater temperature, power supply, susceptor position, and other parameters of the bi-layer polysilicon deposition process of the present invention. The computer program code can be written in any conventional computer readable programming language such as 68000 assembly language, C, C++, Pascal, Fortran, or others. Subroutines for carrying out process gas mixing, pressure control, and heater control are stored within memory 902. Also stored in memory 902 are process parameters such as process gas flow rates and compositions, temperatures, and pressures necessary to form a polycrystalline silicon film having a random grain microstructure and a polycrystalline silicon film with a large columnar microstructure as described above. Thus, according to an embodiment the present invention LPCVD chamber 400 includes in memory 902 instructions and process parameters for: providing a silicon source gas and a dilution gas mix into chamber 490 wherein the dilution gas mix comprises between 8–20% $H_2$ (by volume) and the remainder an inert gas; for providing a second process gas mix comprising a silicon source gas and a dilution gas where the dilution gas comprises between 0–5% $H_2$ (by volume) and the remainder an inert gas; for heating the susceptor 405 to a temperature between 700–740° C.; and for generating a pressure between 150–350 torr within chamber 490 so that a bi-layer polycrystalline silicon film can be deposited by thermal chemical vapor deposition onto a wafer.

Thus, a bi-layer polycrystalline silicon film and its method of fabrication have been described.

We claim:

1. A method of forming an electrode comprising:

forming a lower polysilicon film having a random grain microstructure at a substrate temperature between 670–710° C. wherein said lower polysilicon film has a thickness between 200–500 Å; and forming an upper polysilicon film on the lower polysilicon film, said upper polysilicon film having a columnar grain microstructure wherein said upper polysilicon film is formed at a substrate temperature between 670–710° C.

2. The method of forming an electrode comprising:

forming a lower polysilicon film having a crystal orientation dominated by the <111> direction; and forming a upper polysilicon film on the lower polysilicon film, wherein the upper polysilicon film has a crystal orientation dominated by the <220> direction.

3. A method of forming a bi-layer polysilicon film comprising:

placing a substrate in a deposition chamber;

forming a first polysilicon film above said substrate by flowing into said deposition chamber a first process gas mix comprising a silicon source gas and a first dilution gas mix wherein the first dilution gas mix comprises $H_2$ and an inert gas wherein $H_2$ comprises at least 8% of said first dilution gas mix by volume; and forming a second polysilicon film on said first polysilicon film by providing a second process mix comprising a silicon source gas and a second dilution gas mix wherein the second dilution gas mix comprises $H_2$ and an inert gas wherein $H_2$ comprises less than 8% of said second dilution gas mix by volume.

4. The method of claim 3 wherein said $H_2$ comprises less than 20% of said first dilution gas mix by volume.

5. The method of claim 3 wherein said second dilution gas mix contains no $H_2$.

6. The method of claim 3 wherein said first polysilicon film and said second polysilicon film are formed insitu in said deposition chamber.

7. The method of claim 3 further comprising the step of ion-implanted boron atoms into said first polysilicon film.

8. The method of claim 7 further comprising the step of heating said substrate to activate said ion-implanted boron atoms.

9. A method of forming a bi-layer polysilicon film comprising:

placing a substrate in a deposition chamber;

forming a first polysilicon film above said substrate by flowing into said deposition chamber of first process gas mix comprising a silicon source gas and a first dilution gas mix wherein the first dilution gas mix comprises $H_2$ and an inert gas wherein $H_2$ comprises a first percentage of said first dilution gas mix by volume; and forming a second polysilicon film on said first polysilicon film by providing a second process gas mix comprising said silicon source gas and a second dilution gas mix wherein said second dilution gas mix comprises $H_2$ and said inert gas wherein $H_2$ comprises a second percentage of said second dilution gas mix by volume, wherein said second percentage is less than said first percentage.

10. A method of forming a bi-layer polysilicon film comprising:

placing a substrate in a deposition chamber;

forming a first polysilicon film having a crystal orientation dominated by the <111> direction above said substrate by heating said substrate to a temperature between 670–710° C. and flowing into said deposition chamber a first process gas mix comprising a silicon source gas and a first dilution gas mix wherein the first dilution gas mix comprises $H_2$ and an inert gas wherein said first polysilicon film is formed at a first temperature; and forming a second polysilicon film on said first polysilicon film by heating said substrate to a temperature between 670–710° C. and providing a second process gas mix comprising said silicon source gas and a second dilution gas mix wherein said second dilution gas mix comprises $H_2$ and said inert gas, wherein said second polysilicon film is formed at a second temperature, wherein said second temperature is greater than said first temperature.

11. A method of forming a bi-layer polysilicon film comprising:

placing a substrate in a deposition chamber;

forming a first polysilicon film having a random grain structure above said substrate by flowing into said deposition chamber of first process gas mix comprising a silicon source gas and a dilution gas mix comprising $H_2$ and an inert gas wherein $H_2$ comprises a first percentage of said first dilution gas mix by volume; and forming a second polysilicon film having columnar grain structure on said first polysilicon film by reducing said $H_2$ volume percent in said dilution gas mix.

12. A method of forming a bi-layer polysilicon film comprising:

placing a substrate in a deposition chamber;

forming a first polysilicon film having random grain structure with an average grain size between 50–500 Å above said substrate to a thickness between 300–500 Å by heating said substrate to a first temperature between 670–710° C. and by flowing into said deposition chamber of first process gas mix comprising a silicon source gas and a dilution gas mix wherein the dilution gas mix comprises $H_2$ and an inert gas; and forming a second polysilicon film having a columnar grain structure on said first polysilicon film by heating said substrate to a temperature between 670–710° C. and providing said first process gas mix and wherein said second polysilicon film is formed at a second temperature, wherein said second temperature is greater than said first temperature.

13. A method of forming a bi-layer polycrystalline silicon film comprising:

forming a lower polycrystalline silicon film by thermal chemical vapor deposition by heating said substrate to a temperature between 670–710° C. wherein said lower polycrystalline silicon film has a random grain microstructure; and forming an upper polycrystalline silicon film on said lower polycrystalline silicon film by thermal chemical vapor deposition wherein said upper polysilicon film has a columnar grain microstructure and is formed at a substrate temperature between 670–710° C.

14. The method of claim 13 wherein said lower polycrystalline silicon film is formed at deposition pressure of between 150–350 torr.

15. The method of claim 13 wherein said lower polycrystalline silicon film is formed at a deposition rate between 1500–5000 Å per minute.

16. The method of claim 13 wherein said lower polycrystalline silicon film is formed at a pressure between 150–350 and is formed at a deposition rate between 1500–5000 Å per minute.

17. The method of claim 13 wherein said lower polycrystalline silicon film has a crystal orientation dominated by the <111> direction.

18. The method of claim 13 wherein said lower polysilicon film is formed by flowing a first process gas mix comprising a silicon source gas and a first dilution gas mix wherein the first dilution gas mix comprises $H_2$ and an inert gas wherein $H_2$ comprises at least 8% of said first gas solution mix by volume.

19. The method of claim 13 wherein said upper polycrystalline silicon film is formed at a deposition pressure between 150–350 torr.

20. The method of claim 13 wherein said lower polycrystalline silicon film has a random grain microstructure with an average grain size between 50–500 Å.

* * * * *